United States Patent [19]

Seo et al.

[11] Patent Number: 4,868,484

[45] Date of Patent: Sep. 19, 1989

[54] REFERENCE VOLTAGE GENERATOR USING A CHARGING AND DISCHARGING CIRCUIT

[75] Inventors: Dong-Il Seo, Junju; Je-Hwan Ryu, Dangjin, both of Rep. of Korea

[73] Assignee: SamSung Electronics Co., Ltd., Suweon, Rep. of Korea

[21] Appl. No.: 292,340

[22] Filed: Dec. 30, 1988

[30] Foreign Application Priority Data

Apr. 30, 1988 [KR] Rep. of Korea ............ 1988-5019[U]

[51] Int. Cl.$^4$ ............................................. G05F 3/20
[52] U.S. Cl. .................................... 323/314; 323/313
[58] Field of Search ............................... 323/313, 314; 307/296 R, 297

[56] References Cited

U.S. PATENT DOCUMENTS 4,641,081  2/1987  Sato et al. ............................ 323/313
4,788,455  11/1988  Mori et al. ......................... 323/314

*Primary Examiner*—Patrick R. Salce
*Assistant Examiner*—Jeffery Sterrett
*Attorney, Agent, or Firm*—Robert E. Bushnell

[57] ABSTRACT

There is disclosed a circuit for generating a reference voltage including first means for lowering the the input bias below an externally applied voltage and reducing first the variation of the voltage level due to the applied voltage, second means for causing the flow of a current depending on the output of said first means to sense the applied voltage state and generating the reference voltage increased by the amount of voltage dropped through the resistance produced according to said current flow to the output terminal of said reference voltage when a fixed constant voltage is applied, and third means for charging and discharging a part of the applied current according to the applied voltage variation of said second means.

9 Claims, 2 Drawing Sheets

REFERENCE VOLTAGE GENERATOR USING A CHARGING AND DISCHARGING CIRCUIT

BACKGROUND OF THE INVENTION

1. Technical Field

The present invention concerns a circuit for generating the reference voltage of the address buffer in a dynamic random access memory(DRAM), and more particularly a circuit which supplies a current to the terminal for forming the reference voltage, during low voltage of Vcc, and discharges a part of the current of the terminal for forming the reference voltage, during high voltage, so that the variation of the reference voltage is reduced and transient phenomena during the low voltage are eliminated, therein using a charging-up and discharging circuit.

2. Related Art

Generally, the circuit for generating the reference voltage of a DRAM is to distinguish the address information of the address buffer between a logic "1" signal and a logic "0" signal. Conventionally, there are mainly used the circuits according to FIGS. 1 and 2 of this drawings attached to the specification. Referring to FIGS. 1 and 2, the P MOS transistor M1 is in series with the N MOS transistor M2 that has a diode structure to determine the reference voltage.(see FIG. 1). The P MOS transistor M1 has a diode structure to adjust the reference voltage. However, such a kind of circuit has a drawback that the level of the reference voltage is susceptible to variations in the power supply voltage Vcc. On the other hand, the circuit according to FIG. 2 includes N,P MOS transistors M3, M4, and the diodes D1,D2 so that the N MOS transistor M4 as well as P MOS transistor M3 is turned ON by the voltage Vcc. Therefore, the P,N MOS transistors M3, M4 are always turned ON. According to this conventional circuit, the amount of the current is limited in the standby state, and the level of the reference voltage is determined by the threshold voltages of the two diodes D1, D2 and the ON-state resistance of the N MOS transistor M4. However, there occurs a problem that the level of the output voltage of Vcc is transiently changed (shooting) in low voltage region.

SUMMARY OF THE INVENTION

The object of the present invention is to provide a circuit for eliminating the transient phenomena in low voltage in the address buffer and producing a reference voltage that is less variable according to the applied voltage, so as to stabilize the distinction of the address information between the logic "0" and "1" signals.

According to the present invention, a circuit for generating a reference voltage includes first means for lowering the input bias below an externally applied voltage, second means for flowing a current depending on the output of said first means to sense the applied voltage state and generating the reference voltage increased by the amount of voltage dropped through the resistance produced according to said current flow to the output terminal of said reference voltage, when a fixed constant voltage is applied, and third means for charging and discharging a part of the applied current according to the applied voltage variation of said second means.

The present invention will now be described more specifically with reference to the drawings attached only by way of example.

DETAILED DESCRIPTION OF THE INVENTION

Figures 1, 2:
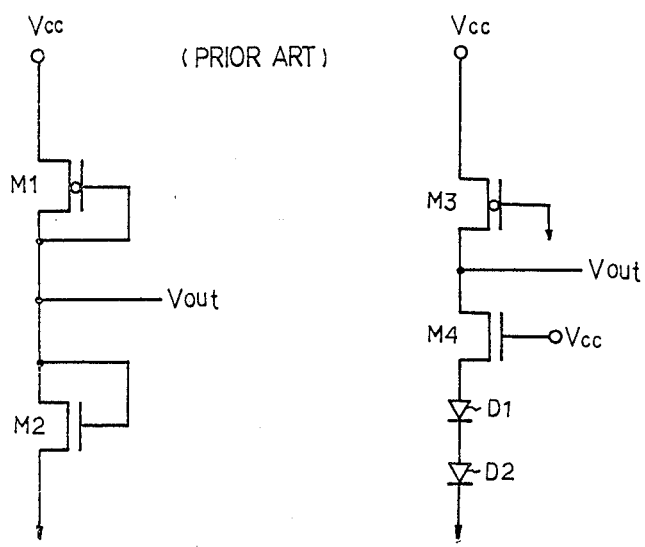
FIG. 1 and 2 are diagrams of conventional circuits.
Figure 3:
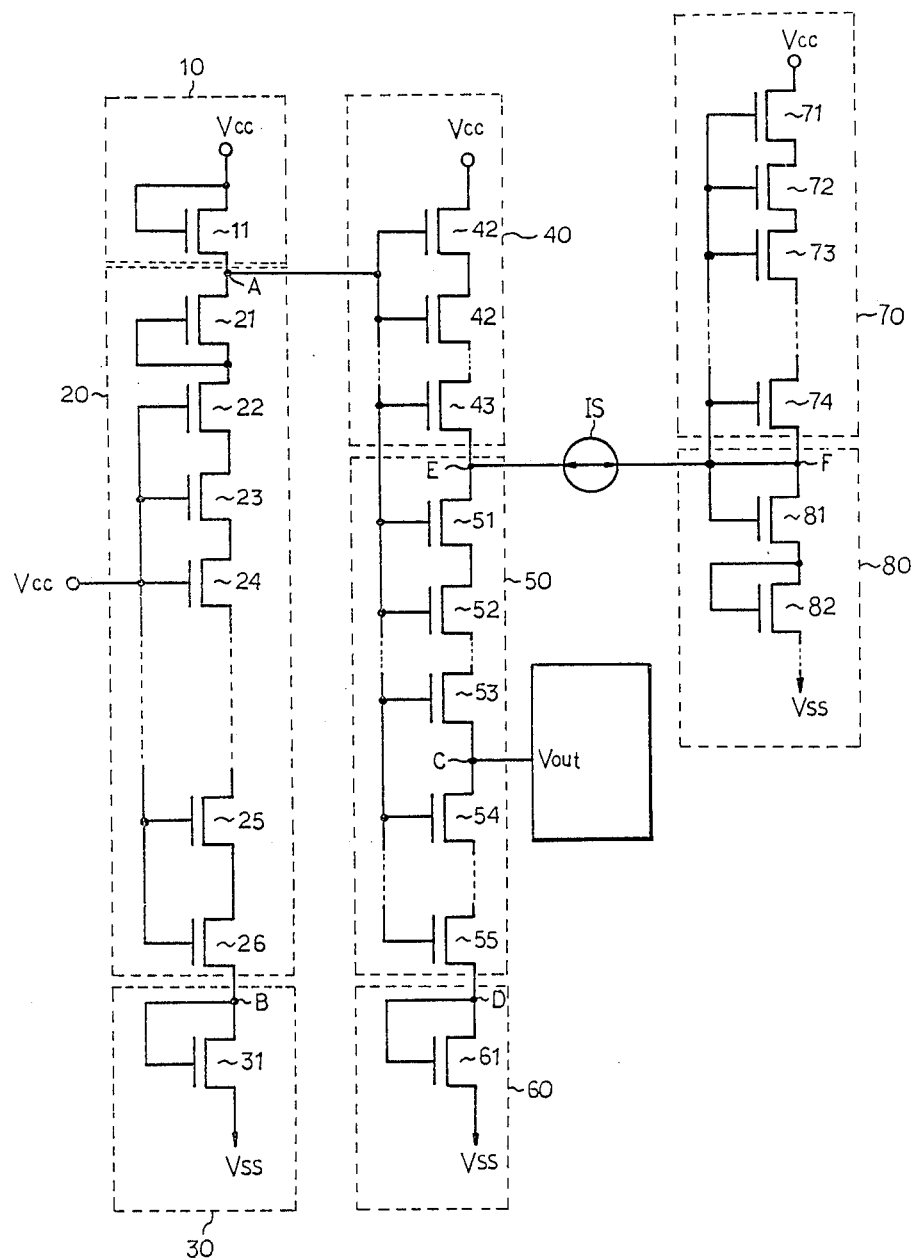
FIG. 3 is a diagram of the circuit according to the present invention.

Referring to FIG. 3 of the circuit according to the present invention, a first resistance circuit 10 comprises a N MOS transistor 11 formed into a diode type from the voltage supply terminal Vcc so as to have a resistance component. To the source terminal A of the N MOS transistor 11 is coupled a N MOS transistor 21 into a diode type. The source of the N MOS transistor 21 configured is connected with a plurality of N MOS transistors 22-26 in series. The gates of the N MOS transistors 22-26 are connected with the voltage supply terminal Vcc. The N MOS transistors 21-26 constitute a second resistance circuit 20 including a first number of N MOS transistors so as to have a resistance component. With the source node B of the N MOS transistor 26 in said second resistance circuit is connected a N MOS transistor 31 configured into a diode type so as to maintain a constant voltage, which constitutes a first constant voltage means 30. A third resistance circuit 40 comprises a second number of N MOS transistors 41-43 connected in series between the voltage supply terminal Vcc and a node E. The gates of the N MOS transistors 41-43 are connected with node A. The third resistance circuit is adapated to have a fixed resistance component. A fourth resistance circuit 50 includes a third number of N MOS transistors 51-55 so as to have a resistance component. The node A is connected with the gates of the N MOS transistors 51-55. The N MOS transistors 51-53 are connected with each other in series. The source terminal code C of the N MOS transistor 53 is connected to the output terminal Vout and the drain of the N MOS transistor 54. A specified number of the N MOS transistors 54-55 connected in series to each other constitutes a part of the fourth resistance circuit. With the source terminal node D is coupled the N MOS transistor 61 of diode type so as to maintain a constant voltage, which constitutes the second constant voltage means 60. With the voltage terminal Vcc are connected in series a fourth number of NMOS transistors 71-74, whose gates are connected to a node E between the source terminal of N MOS transistor 43 and the drain terminal of N MOS transistor 51; transistors 71-74 are also connected to the voltage terminal Vcc, which constitutes a fifth resistance circuit 70 so as to have a fixed resistance component. The connecting node E between the third and fourth resistance component. The connecting node E between the third and fourth resistance circuits 40 and 50 is connected with the drain and the gate of the N MOS transistor 81. The source of the N MOS transistor 81 is connected with the drain of a fifth number of N MOS transistors 82 of diode type. The N MOS transistors 81-82 constitute a third constant voltage means 80 to maintain the reference voltage constant regardless of the variation of the voltage terminal Vcc.

Hereinafter, the operations and effects of the exemplary embodiment of the circuit will be explained. Because the first resistance circuit 10 and N MOS transistor 21 are coupled into the diode type configurations, the N MOS transistor 31 connected with the terminal Vss keeps constant the voltage of the node B. The node A has a resistance created by the path for the current to flow from the voltage terminal Vcc to the terminal Vss since the first number of N MOS transistors 21–26 are turned ON by the voltage terminal Vcc. This has the voltage drop of the N MOS transistors 21–26 so as to be lowered below the voltage of the voltage supply terminal Vcc according to the input bias, and firstly reduces the level of variation due to the voltage variation of the voltage terminal Vcc. When the N MOS transistors 41–43, 51–53, 54–55 included within the third and fourth resistance circuits 40, 50 are driven by the output of the node A, the drain node C of the N MOS transistor 54 of the fourth resistance circuit 50 establishes at the node D a constant voltage increased by the voltage dropped in the N MOS transistors 54, 55, since the node D receives a constant voltage from the N MOS transistor 61. By this construction may be generated the reference voltage, but the range of the voltage variation increases according to the applied voltage.

In order to eliminate the wide ranging variation of the voltage, it is necessary to by-pass the current flowing into the node E when the voltage of the terminal Vcc is high, and to add a current to the node when the voltage is low, so that the variation of the current flowing in the fourth resistance circuit 50 can be reduced. By the fifth resistance circuit 70 of the node F connected with the node E, the drain of the N MOS transistor 74 receives a voltage somewhat less variable according to the voltage terminal Vcc. At a high voltage of Vcc, as the voltage of the node F is lower than that of the node E, the node E is discharged to the node F. Whereas, at low voltage, as the voltage of the node F is higher than that of the node E, the node F is discharged to the node E.

As described above, in the circuit for generating a reference voltage according to the present invention, a part of the current is discharged at high voltage, while the charge is supplemented at low voltage, so that the transient phenomena are eliminated and the reference voltage is less varied regardless of the external voltage variation, thereby stabilizing the distinction of the address signal.

The foregoing description shows only a preferred embodiment of the present invention. Various modifications are apparent to those skilled in the art without departing from the scope of the present invention which is only limited by the appended claims. Therefore, the embodiment shown and described is only illustrative and is, not restrictive.

What is claimed is:

1. In a network having resistance elements and diodes between an external voltage supply terminal and a ground terminal, a circuit comprising:
    first means producing an output for lowering input bias below an externally applied voltage and reducing the level of variation due to the applied voltage;
    second means for causing a current flow in dependence upon the output of said first means to sense the state of said applied voltage and generating a reference voltage increased by the amount of voltage dropped through resistance according to said current flow to an output terminal of said reference voltage when a fixed constant voltage is applied; and
    third means for charging and discharging a part of the applied current according to the applied voltage variation of said second means.

2. A circuit as claimed in claim 1, wherein said third means comprises a resistance circuit and a diode so that, depending on the variation of the applied voltage, when the voltage of a node of the second means is low, said node is charged with an additional current, and when the voltage of said node is high, said node is discharged, thereby generating a constant said reference voltage irrespective of the applied voltage.

3. A circuit having resistance elements and diodes coupled between an external voltage supply terminal and a reference potential terminal, for generating a reference voltage, comprising:
    first means for producing an output by lowering an input bias voltage to a value below an externally applied voltage;
    second means for producing a current flow in dependence upon the output of said first means to sense the state of said applied voltage, and for generating at an output terminal a reference voltage increased by a voltage drop through resistance to said current flow to said output terminal; and
    third means for charging and discharging a part of said current flow in accorance with variations of said applied voltage.

4. The circuit of claim 3, wherein said third means comprises a resistance stage and a diode, whereby when voltage at a node of said second means is low, an additional current is added to said current flow via said node, and when voltage at said node is high, part of said current flow is discharged via said node.

5. A circuit for generating a reference voltage, comprising:
    first means coupled between an external voltage terminal and a reference potential terminal, for responding to an externally applied voltage at said external voltage terminal by lowering a first voltage drop to a value below said externally applied voltage to produce an output;
    second means coupled between said external voltage terminal and said reference potential terminal and driven by said output, for providing a current flow to generate a reference voltage equal to the sum of a second voltage drop due to said current flow and a constant voltage; and
    third means coupled between said external voltage terminal and said reference potential terminal, for supplementing said current flow when a first node voltage of said second means is lower than a second node voltage of said third means and for dissipating said current flow when said second node voltage is lower than said first node voltage.

6. The circuit of claim 5, when said third means comprises a resistance and a diode.

7. A circuit for generating a reference voltage, comprising:
    a first resistance stage coupled to an external voltage terminal;
    a second resistance stage forming a first node with said first resistance stage, coupled to said external reference terminal, and exhibiting a voltage drop having a value lower than a voltage externally applied to said external voltage terminal;
    first potential means coupled between said second resistance and a reference potential terminal, for providing a first constant voltage;
    second potential means coupled to said reference potential terminal, for providing a second constant voltage at a second node;

first resistance means coupled to said external voltage terminal and to said first node, for providing a fixed first resistance component;

second resistance means coupled between said first and second nodes and a third node formed with said first resistances and having second and third resistance components, for providing a reference potential equal to the sum of a voltage drop due to current flow through said second and third resistance components and said second constant voltage, at a fourth node intermediate said second and third resistance components;

third potential means coupled to said reference potential terminal, for providing a third constant voltage at said third node; and third resistance means coupled between said external voltage terminal and said third node, for providing a fixed second resistance component.

8. The circuit of claim 7, wherein said third resistance means comprises a resistance stage and said third potentials means comprises a diode, whereby when voltage at said third node is low, an additional current is added to said current flow via said third node, and when voltage at said third node is high, part of said current flow is discharged via said third node.

9. The circuit for generating a reference voltage, comprising:

the first transistor having a gate electrode coupled to an applied voltage terminal and conduction electrodes coupled between said applied voltage terminal and the first node;

the second transistor having a gate electrode coupled to a second node and conduction electrodes coupled between said first and second nodes;

a plurality of third transistors having gate electrodes coupled to said applied voltage terminal and conduction electrodes serially coupled between said second node and a third node;

the fourth transistor having a gate electrode coupled to said third node and conduction electrodes coupled between said third node and a reference potential terminal;

a plurality of sixth transistors having gate electrodes coupled to said first node and conduction electrode serially coupled between said applied voltage terminal and the fourth node;

a pluarlity of sixth transistors having gate electrodes coupled to said first node and conduction electrodes serially coupled between said fourth node and a fifth node;

a plurality of seventh transistors having gate electrodes coupled to said first node and conduction electrodes serially coupled between said fifth node and a sixth node;

an eighth transistor having a gate electrode coupled to said sixth node and conduction electrodes coupled between said sixth node and said reference potential terminal;

a pluarlity of ninth transistors having gate electrodes coupled to said fourth node and conduction electrodes coupled between said applied voltage terminal and said fourth node;

a tenth transistor having a gate electrode coupled to said fourth node and conduction electrodes coupled between said fourth node and a seventh node; and an eleventh transistor having a gate electrode coupled to said seventh node and conduction electrodes coupled between said seventh node and said reference potential terminal.

* * * * *